United States Patent [19]
Roemer et al.

[11] Patent Number: 4,825,162
[45] Date of Patent: Apr. 25, 1989

[54] NUCLEAR MAGNETIC RESONANCE (NMR) IMAGING WITH MULTIPLE SURFACE COILS

[75] Inventors: Bernard Roemer; William A. Edelstein, both of Schenectady, N.Y.

[73] Assignee: General Electric Company, Schenectady, N.Y.

[21] Appl. No.: 130,046

[22] Filed: Dec. 7, 1987

[51] Int. Cl.$^4$ ............................................. G01R 33/20
[52] U.S. Cl. ...................................... 324/318; 324/312
[58] Field of Search .............. 324/302, 309, 311, 318, 324/322, 312; 335/299

[56] References Cited

U.S. PATENT DOCUMENTS

| | | | |
|---|---|---|---|
| 4,682,112 | 7/1987 | Beer | 324/322 |
| 4,721,413 | 1/1988 | Hyde et al. | 324/318 |
| 4,728,896 | 3/1988 | Bendall et al. | 324/322 |
| 4,733,183 | 3/1988 | Young | 324/318 |
| 4,777,438 | 10/1988 | Holland | 324/318 |

OTHER PUBLICATIONS

"High Resolution Magnetic Resonance Imaging Using Surface Coils" J. F. Schenck, et al., *Magnetic Resonance Annual 1986*, ed. H. Y. Kressel, (1986) pp. 123–160.

Primary Examiner—Stewart J. Levy
Assistant Examiner—Kevin D. O'Shea
Attorney, Agent, or Firm—Geoffrey H. Krauss; James C. Davis, Jr.; Marvin Snyder

[57] ABSTRACT

A method for simultaneously receiving a different NMR response signal from each of a plurality of closely-spaced surface coils, first provides an array of a plurality of the surface coils, each positioned so as to have substantially no interaction with all adjacent surface coils. A different NMR response signal is received from an associated portion of the sample enclosed within an imaging volume defined by the array. Each different NMR response signal is used to construct a different one of a like plurality of NMR images of the sample, with the plurality of different images then being combined, on a point-by-point basis, to produce a single composite NMR image of a total sample portion from which NMR response signal contribution was received by any of the array of surface coils. Interactions between non-adjacent surface coils are minimized by coupling each onto an associated preamplifier.

18 Claims, 9 Drawing Sheets

NUCLEAR MAGNETIC RESONANCE (NMR) IMAGING WITH MULTIPLE SURFACE COILS

BACKGROUND OF THE INVENTION

The present invention relates to nuclear magnetic resonance (NMR) imaging and, more particularly, to methods and apparatus for simultaneously receiving a different NMR response signal from each of a plurality of closely-positioned radi-frequency (RF) coils, having substantially reduced interactions therebetween.

Present-day NMR imaging systems utilize receiver coils which surround the entire sample (for example, a human patient) which is to be imaged. These "remote coils" have the advantage that the sensitivity to individual spins is, to a first approximation, substantially constant over the entire region being imaged. Although this uniformity is not strictly characteristic of such remote coils, it is substantially constant to a sufficient degree that most present-day reconstruction techniques assume a constant coil sensitivity. Because of their large size, such remote coils suffer from two disadvantages: first, a relative insensitivity to individual spins; and, second, a relatively large inductance and, therefore, a low self-resonant frequency. It is well known that surface coils do not have a uniform sensitivity to individual spins within the region; images produced using surface coils requie additional compensation for such inhomogeneity. Surface coils can, however, be made much smaller in geometry than remote coils and for medical diagnostic use can be applied near, or on, the body surface of the sample patient. This is especially important where attention is being directed to imaging a small region within the sample, rather than an entire anatomical cross section. Because the surface coil reception element can be located closer to the spins of interest, a given spin will produce a larger EMF, at a given Larmor frequency, in a surface coil than in a remote coil. The use of a surface coil also reduces the nose contribution from electrical losses in the body, with respect to a corresponding remote coil, while maximizing the desired signal.

NMR imaging systems thus typically use a small surface coil for localized high resolution imaging. A single surface coil of diameter D gives the highest possible single-to-noise ratio (SNR) for that volume around a depth D inside an infinite conducting half space. However, the single surface coil can only effectively image that region with lateral dimensions comparable to the surface coil diameter D. Therefore, the use of a surface coil necessarily restricts the field-of-view and inevitably leads to a trade-off between resolution and field-of-view. Since the fundamental limitation of the SNR of a surface coil is its intrinsic signal-to-noise ratio, wherein the noise resistance is attributable to currents induced in the sample (for example, a patient in a medical NMR imaging situation) by the radio-frequency (RF) receiving coil. Larger coils induce greater patient sample losses and therfore have a larger noise resistance; smaller coils have a lower noise resistance but, in turn, restrict the field of view to a smaller region.

It is highly desirable to extend the field-of-view by providing a set of surface coils arrayed with overlapping fields-of-view. However, it is desirable to at the same time maintain the high SNR of the single surface coil, if at all possible; this requires that mutual coil interactions be alleviated. It is also highly desirable to be able to construct a single optimal image, which maximizes the signal-to-noise ratio in each pixel of the composite single image, from the partial-image data of each of the plurality of surface coils in the array.

BRIEF SUMMARY OF THE INVENTION

In accordance with the invention, a method for simultaneously receiving a different NMR response signal from each of a plurality of closely-spaced surface coils, provides an array of a plurality of the surface coils, each positioned so as to have substantially no interaction with all adjacent surface coils. A different NMR response signal is received at each different one of the surface coils from an associated portion of the sample enclosed within an imaging volume defined by the array. Each different NMR response signal is used to construct a different one of a like plurality of NMR images of the sample, with the plurality of different images then being combined, on a point-by-point basis, to produce a single composite NMR image of a total sample portion from which NMR response signal contribution was received by any of the array of surface coils.

In a presently preferred embodiment of the present invention, each surface coil is connected to the input of an associated one of a like plurality of low-input-impedance preamplifiers, which minimize the interaction between any surface coil and other surface coils not immediately adjacent thereto. Surface coils of several geometries, e.g., circular, square and thelike, can be utilized.

Accordingly, it is an object of the present invention to provide novel methods for NMR imaging utilizing a plurality of surface coil antennae configured for simultaneous reception.

It is an other objection to provide apparatus for NMR pickup imaging utilizing a plurality of surface coil antennae configured for simultaneous reception.

These and other objects of the present invention will become apparent upon a reading of the following detailed description, when considered in conjunction with the drawings.

DETAILED DESCRIPTION OF THE INVENTION

Figure 1:
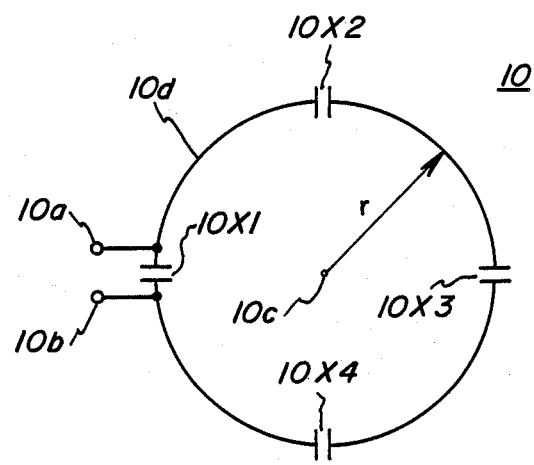
FIGS. 1 and 1a are respectively a schematic plan view of a single circular surface coil and a graph of the surface coil sensitivity S vs. frequency f response curve thereof.
Figure 1A:
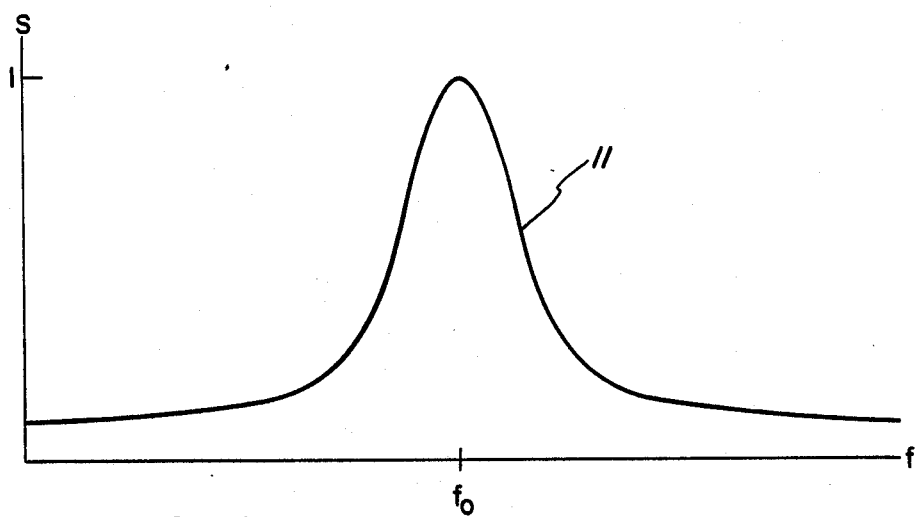

Referring initially to FIGS. 1 and 1a, a surface coil 10 extends from a first end 10a to a second end 10b, and is of substantially circular form, with a radius r about a center 10c. A conductive coil element 10d is in series connection with a plurality of impedance elements 10X, here electrical capacitances $10 \times 1 - 10 \times 4$. When radio-frequency (RF) energy with substantially constant amplitude over a broad frequency spectrum impinges upon surface coil 10, the amplitude of received energy signals provided between coil ends 10a and 10b has a sensitivity S vs. frequency f response curve 11, with a sensitivity peak at the self-resonant frequency $f_o$ of the surface coil 10.

Figure 1B:
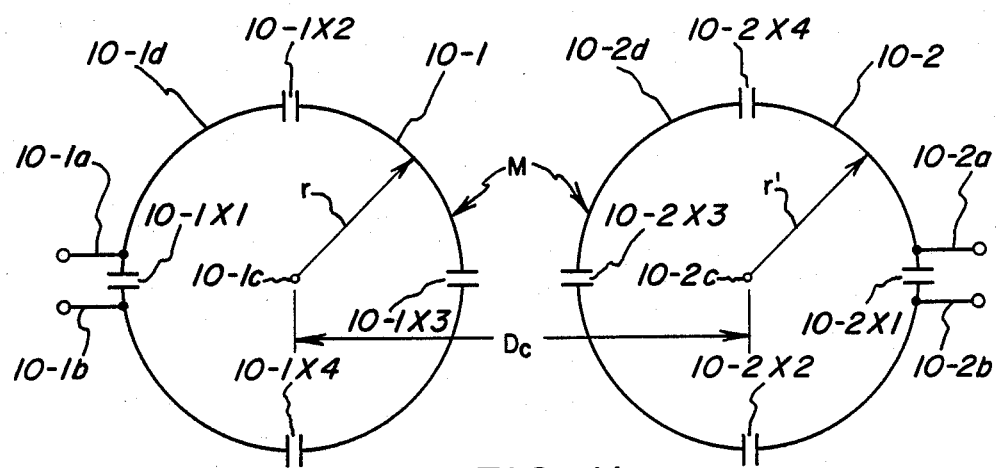
FIGS. 1b and 1c are, respectively, a plan view of a pair of coupled circular surface coils and a graph of the sensitivity S vs. frequency f response curve thereof.
Figure 1C:
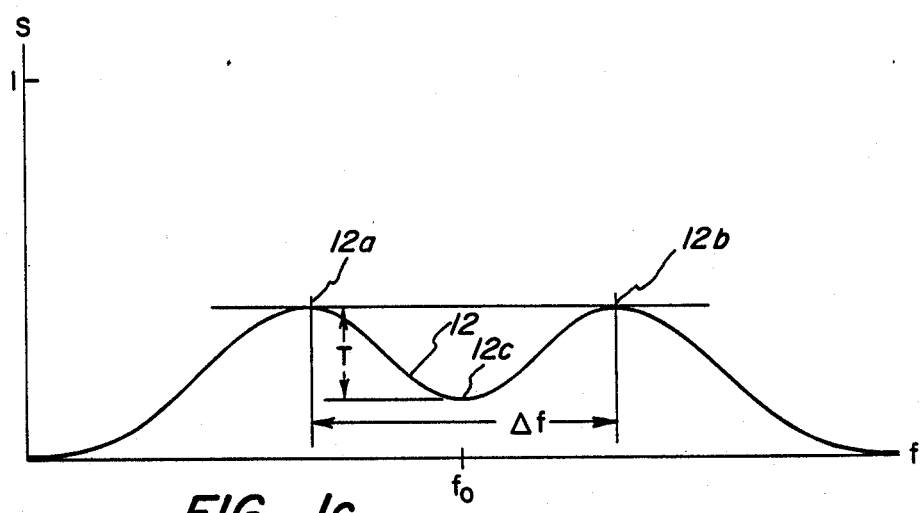

Referring now to FIGS. 1b and 1c, a first surface coil 10-1 can be located in proximity to a second surface coil 10-2, with a degree of inductive coupling M between the surface coil conductors 10-1d and 10-2d. The simple resonance of a single coil changes to two resonant modes of the two coils. One mode corresponds to currents in the two coils going inthe same direction, and the other mode corresponds to oppositely directed currents. The resonant frequencies of these modes are split away from the original resonance, with one resonant frequency now above the original resonance and one below, giving the appearance of a "double bump" in the response curve. This shift is seen in the sensitivity S vs. frequency f response curve 12, wherein a first peak 12a appears below self-resonant frequency $f_o$, while a second peak 12b appears above self-resonant frequency $f_o$; a minimum trough 12c is now present at the self-resonant frequency $f_o$. The normalized amplitude of the peaks 12a and 12b is less than the normalized unit amplitude of a single surface coil peak. The depth T of trough 12c, with respect to the amplitude of off-resonant peaks 12a and 12b, as well as the peak 12a-peak 12b separation $\Delta f$, depends at least in part upon the inductive coupling M, and therefore upon the center-to-center distance $D_c$, between coil centers 10-1c and 10-2c.

Figure 2A:
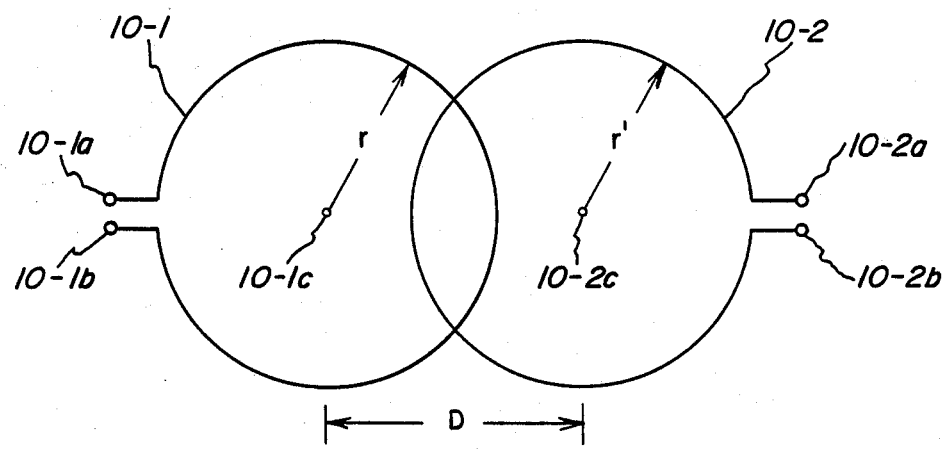
FIGS. 2a and 2b are plan views of pairs of surface coils, respectively of circular and rectangular shape, so situated so as to have substantially minimized interaction with one another.
Figure 2B:
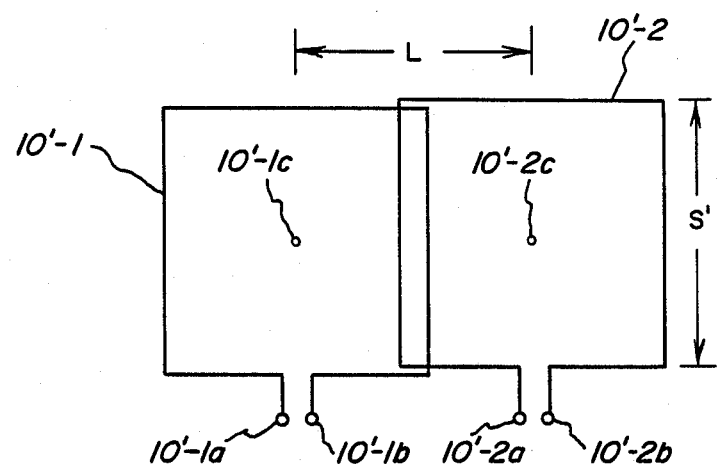

Referring now to FIGS. 2a and 2b, a coil-to-coil separation distance D, between the centers of a pair of adjacent coils in a one-dimensional array, can be found such that the mutual inductive coupling M is minimized. For a pair of circular surface coils 10-1 and 10-2 with substantially the same radii (r=r'), separation distance D is approximately equal to 0.75d, or D—1.5r (FIG. 2a). Surface coils can be of non-circular form; a pair of noncircular coils 10'-1 and 10'-2 may be substantially square, with side dimension S'. For minimized mutual inductance M, the center 10'-1c of a first substantially-square coil is separated from the center 10'-2c of the adjacent substantially-square coil by coil-to-coil separation distance L of about 0.9 S'. It should be understood that mutual inductance can be reduced substantially to zero, thereby eliminating the mutual coupling between adjacent coils and the problem of resonance splitting with the nearest neighboring surface coils, but, because of slight imperfections in each practical coil, the approximate overlap only can be calculated from the above formulae and the exact amounts of overlap must be determined empirically. It will also be understood that additional slight differences in spacing and positioning may be required due to the placement of the gap between the coil ends, e.g., the gap between ends 10'-1a and 10'-1b of coil 10'-1; again, empirical fine adjustments of the spacing distance L (or distance D for substantially circular coils) may be required if the gaps are changed from first and second positions, e.g., from opposite placement as shown in FIG. 2a, to same-side placement as shown in FIG. 2b.

Figure 3:
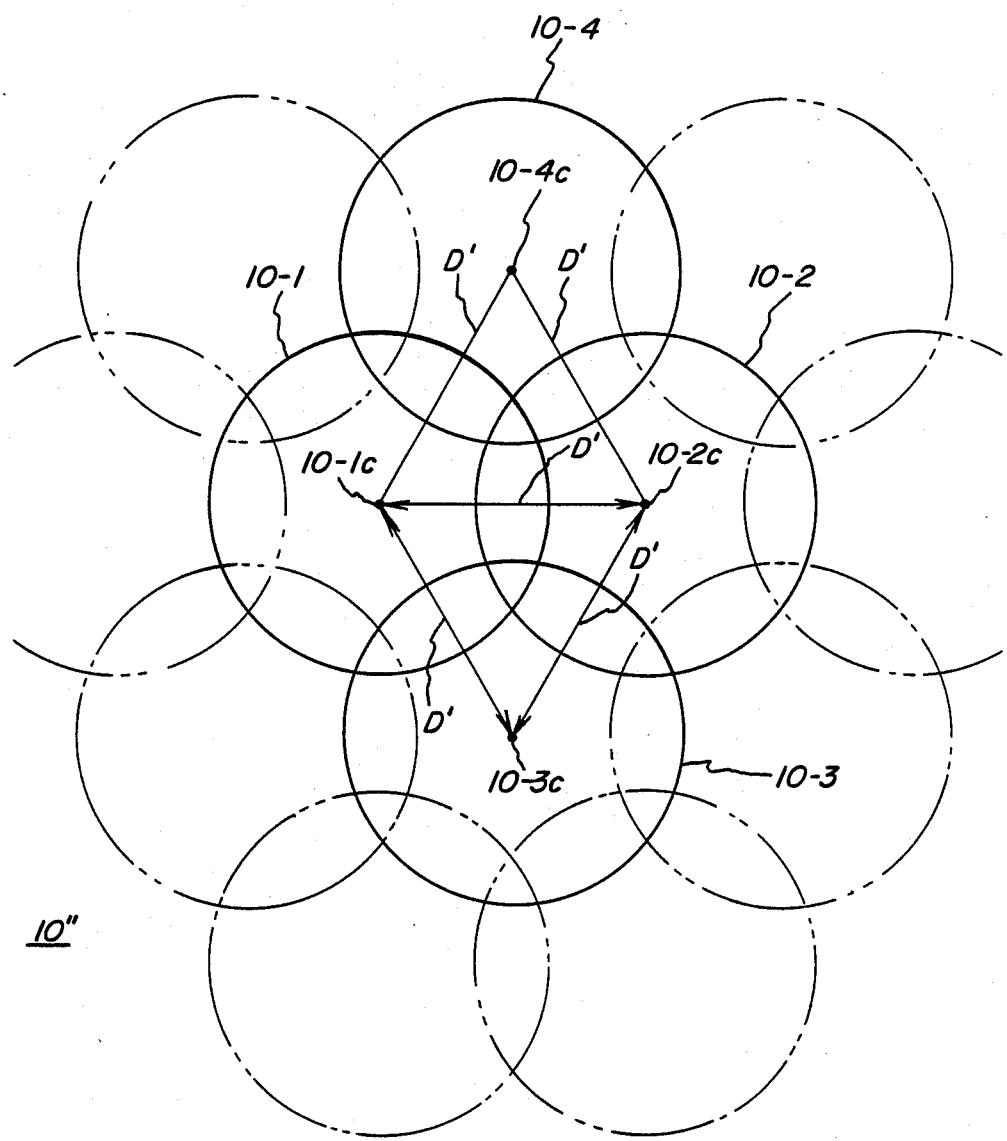
FIG. 3 is a plan view of a multiplicity of circular surface coils, illustrating the manner of two-dimensional placement thereof for minimized coupling of any two adjacent surface coils in the array thus formed.

Referring now to FIG. 3, the rules applied to the linear separation between a pair of adjacent surface coils in a one-dimensional array can also be applied to the center-to-center spacing D' of a plurality of adjacent surface coils forming a part of a two-dimensional array. Here, the three mutually-adjacent circular surface coils 10-1, 10-2 and 10-3 are arranged such that their centers 10-1c, 10-2c and 10-3c are each at a different apex of an equilateral triangle of said D', where the separation distance D' is about 1.5 times the radius of each of the surface coils. Similarly, the three mutually-adjacent circular surface 10-1, 10-2 and 10-4 have their centers 10-1c, 10-2c and 10-4c each at a different apex of an equilateral triangle of side D'. Additional substantially circular surface coils can be added, as shown by the chain-line circles forming phantom portions of the array; each added surface coil is positioned with its center at the apex of another equilateral triangle, formed with centers of real or imagined surface coils of the array. It will be seen that a three-dimensional array of surface coils can also be used, with pyramidal, cubical and the like subsets, or can be obtained by "wrapping" at least one two-dimensional sheet array over a three-dimensional object (such as a portion of human anatomy and the like) to enclose the sample object within the volume enclosed by the array "surface".

Figure 4:
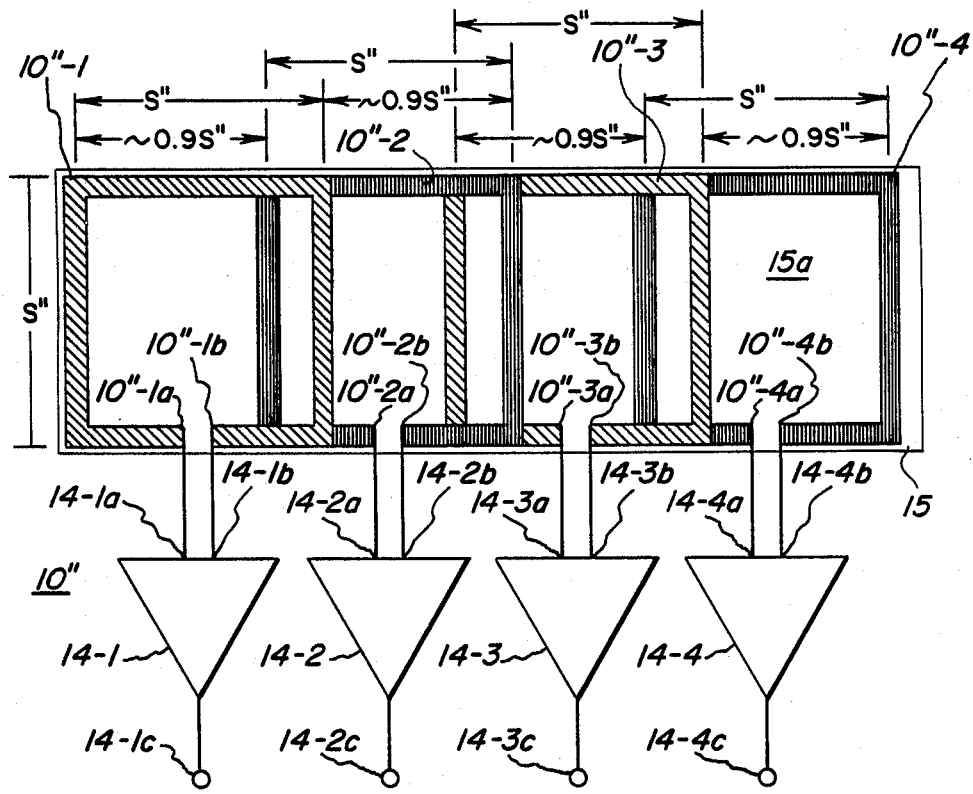
FIG. 4 is a schematic block diagram of an array of four substantially square, overlapped surface coils and of a like number of preamplifiers for use therewith.

The interaction between next-to-nearest-neighbor coils, such as coil 10-4 interacting with coil 10-3, or interaction with even more distant coils, can be reduced to negligible levels by connection of each surface coil output to a preamplifier having a relative low input impedance (typically, less than 10 ohms). This coil array-preamplifier set combination is illustrated in FIG. 4, where a four-coil array 10", specifically utilized in a full-body NMR imager for imaging the human spine, includes first through fourth substantially square surface coils 10"-1 through 10"-4, each having a side dimension S" and an overlap distance of about 0.1 S' for substantially eliminating mutual coupling interaction with the adjacent coil(s). The ends 10"-ia and 10"-ib, where $1 \leq i \leq 4$, of each of the surface coils are connected to the associated inputs 14-ia and 14-ib of one of a like number of low-impedance RF preamplifier means 14. Thus, first surface coil opposite ends 10"-1a and 10"-1b are respectively connected to respective inputs 14-1a and 14-1b of first preamplifier 14-1, which provides a first preamplified surface coil signal at output 14-1c; the second surface coil 10"-2 has first and second ends 10"-2a 10"-2b respectively connected to respective inputs 14-2a and 14-2b of the second preamplifier means 14-2, which provides a preamplified second surface coil signal at output 14-2c; the third surface coil 10"-3 has first and third ends 10"-3a and 10"3b respectively connected to respective inputs 14-3a and 14-3b of the third preamplifier means 14-3, which provides a preamplified third surface coil signal at output 14-3c; and the fourth surface coil 10"-4 has first and second ends 10"-4a and 10"-4b respectively connected to respective inputs 14-4a and 14-4b of the fourth amplifier means 14-4, which provides a preamplified fourth surface coil signal at output 14-4c.

Figure 4A:
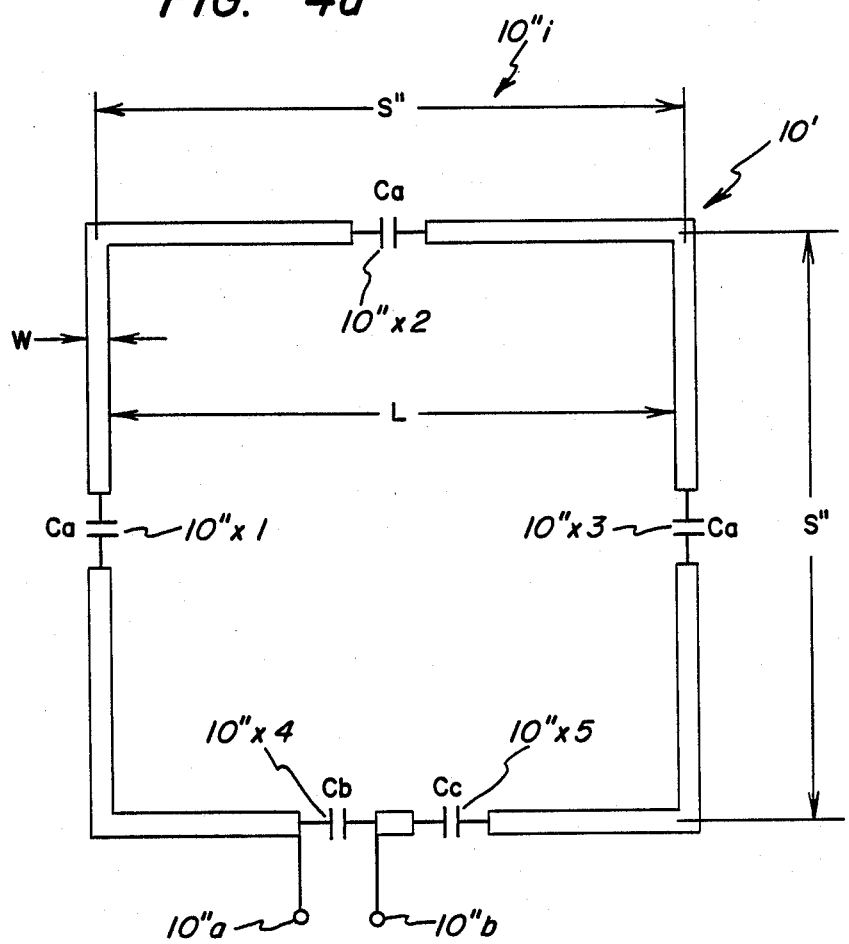
FIG. 4a is a plan view of a square surface coil, utilized in a multiple array thereof, in accordance with the principles of the present invention, and illustrating several dimensions and other features thereof.

Each of the surface coils 10"-1 through 10"-4 can be fabricated, as shown by the surface coil 10"-i in FIG. 4a, with conductive tape of width w (of about 0.5 inches in this example) affixed to a surface 15a of a substrate 15 (i.e. any suitable means for maintaining the relative coil positions) and with interior spacing L (of about 4.25 inches in this example) so that the mid-side of mid-side spacing S" is here about 4.5 inches. Each leg is separated, at approximately the mid point thereof, by a lumped capacitance element. In the three legs not broken for coil connection, these lumped capacitance elements 10"×1, 10"×2 and 10"×3 have substantially identical capacitive values Ca (about 91 pF. for a coil utilized for $^1$H imaging in a system having a static magnetic field $B_0$ of about 1.5 Tesla, and a Larmor, or resonant, frequency $f_0$ of about 63.9 MHz.). The surface coil side having end connections 10"a and 10"b has a terminal-bridging capacitance element 10"×4 of another capacitive value Cb (about 150 pF.), and a side capacitance element 10"×5 of a third value Cc (about 300 pF.).

Figure 5:
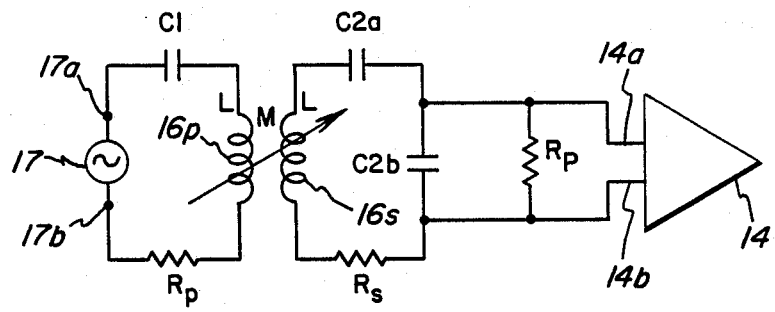
FIG. 5 is a schematic diagram illustrating the coupling between a pair of the surface coils of FIG. 4, along with the preamplifier utilized with one of those surface coils, and useful in understanding principles of the present invention.

Referring now to FIG. 5, the effect of connecting a low-input-impedance preamplifier to a next-nearest-neighbor surface coil can be analyzed by considering the two surface coils as being the primary winding 16p and the secondary winding 16s of a transformer 16. A coupling coefficient k exists between windings 16p and 16s. The primary and secondary windings are both considered to have the same inductance L, with a mutual coupling M=kL. The residual resistance $R_p$ or $R_s$ of the two windings is substantially similar, so that $R_p=R_s=R1$. If the first surface coil (winding 16p of inductance L, with a series capacitance C1 and series resistance R1) is driven by a source 17, we may remove the source and determine (a) whether the impedance seen across the source terminals 17a and 17b is substantially changed, and (b) whether additional dissipation and noise is introduced by the presence of the second surface coil (symbolized by winding 16s, another resistance R1 and the pair of surface coil capacitors C2a and C2b). Without the second surface coil present, the impedance of the primary loop is simply $R_1=R_p$. When the second surface coil is added, the impedance $Z_A$, between terminals 17a-17b, is given as $$Z_A = R1 + \omega^2 M^2/Z_s \quad (1)$$

where $Z_s$ is the series impedance of the secondary surface coil loop. The secondary loop is tuned with multiple capacitors, which can be reduced to capacitors C2a and C2b; the input impedance $R_p$ of a low-impedance preamplifier 14 is effectively in parallel across the second loop output capacitance C2b. Generally speaking, this output capacitance C2a, so that we can quantify the capacitance relationship as $C2b=(N-1)\cdot C2a$. Therefore, the net series capacitance of the secondary surface coil circuit is about C2b/N. The exact impedance $Z_A$ between 17a-17b can thus be calculated as $$Z_A = R1[1 + k^2Q^2/(1+[Q/N](X_c/(R_p-jX_c)))] \quad (2)$$

where the resistance in each of the primary and secondary circuits is approximately R1, the circuit quality factor $Q=\omega L/R1$ and $X_c$ is the reactance of capacitor C2b.

We have found it useful to look at two limits. The first limit occurs if a preamplifier is not attached to capacitor C2b and the second loop is resonant; here the preamplifier impedance $R_p$ goes to infinity and $$Z_A = R1(1+k^2Q^2) \quad (3)$$

Although k is small, the quality factor Q could be large, and the $k^2Q^2$ term in equation (3) might be significant. At the second limit, the preamplifier input impedance $R_p=0$ and equation (2) reduced to $$Z_A = R1(1-jk^2QN) \quad (4)$$

Comparing equations (3) and (4), it will be seen that the effect of the second loop impedance on the first loop can be reduced by a factor of (Q/N), which is a factor substantially greater than 1, by making the preamplifier input impedance substantially equal to zero, as compared to a resonant second loop. The reflected impedance is now imaginary and, at worst, produces a first loop frequency shift, instead of an apparent additional loss in the primary loop. For analysis of a real situation, the illustrative square coil of FIG. 4a (utilized in a four-coil spinal imaging array at 64 MHz), has parameters of: N=6.45, $X_c$=16.6 ohms, Q=361 unloaded and Q=24 loaded. The following Table contains values for the impedance reflected back into the primary surface coil, from the secondary surface coil, when a preamplifier is placed across the secondary surface coil terminals. The Table entries are given in terms of ratio of the total impedance $Z_A$, seen at the primary coil terminal 17a/17b, to the loss resistance R1 which would normally be seen if only the resonant primary surface coil were present. Thus, the impedance ratio has both a real component and an imaginary component. It is the real component which indicates the relative increase in noise, that is, a ratio, for example, of 1.07 (for the unloaded coil with a 10 ohm preamplifier attached to the secondary coil) indicates that the resistance, and hence the noise power, in the primary surface coil has increased by 7% because of the presence of the second coil. Therefore, the system noise figure has increased by about 0.3 db, which is a relatively small amount. It will be seen that in none of the loaded coil examples is there a significant increase in noise, even when the preamplifier is not attached to the second surface coil. The only significant effects occur for unloaded surface coils, with either a 50 ohm input impedance preamplifier, or with no preamplifier present. The imaginary portions of the impedance correspond to a small shift of resonant frequency, which is also seen to be relative insignificant, as all of the imaginary impedance ratio portions have, at most, (R1/10), that is no more than 10% of the series loss resistance R1, and therefore must limit the total frequency shift to less than 0.1 of the resonance width.

| TABLE OF $Z_A/R1$ | | | | | |
|---|---|---|---|---|---|
| Coil Config. | $R_p = 0\ \Omega$ | $5\ \Omega$ | $10\ \Omega$ | $50\ \Omega$ | $\infty\ \Omega$ ohms |
| Unloaded, Q = 361 | 1.00-j 0.114 | 1.04-j 0.113 | 1.07-j 0.112 | 1.33-j 0.103 | 1.38 |
| Loaded, Q = 24 | 1.00-j 0.007 | 1.00-j 0.006 | 1.01-j 0.005 | 1.01-j 0.002 | 1.03 | for k = 0.007 $X_c$ = 15.4 ohms and N = 6.45

We have also calculated the magnitude of current generated in the coil of interest due to currents flowing in a remote coil. The current in the first coil, due to voltages in the first and second coils, is given by:

$$I1 = (-j\omega MV2 - V1Z2)/(Z1Z2 + \omega^2 M^2) \quad (5)$$

where V1 is the first surface coil voltage and Z1 and Z2 are respective first and second surface coil impedances. The ratio of current in coil 1 caused by the second coil voltage 2 to the current caused by voltage 1 is $$ti\ I1(2)/I1(1) = (j\omega M/Z2)(V2/V1) = (J\omega Lk/Z2)(V2/V1) \quad (6)$$

Substitution of the second surface coil impedance yields $$I1(2)/I1(1) = (V2/V1)(jkQ)/(1 + (Q/N)[jX_c + jR_p]) \quad (7)$$

for a preamplifier input impedance $R_p$ comparable to, or smaller than, the capacitive reactance $X_c$, this reduces to $$I1(2)/I1(1) = kN[(X_c + jR_p)/X_c](V2/V1) \quad (8a)$$

or $$I1(2)/I1(1) = kN[1 + (JR_p/X_c)](V2/V1) \quad (8b)$$

utilizing k=0.007 and N=6.45, this reduces to $$I1(2)/I1(1) = 0.045 \quad (9)$$

so that the signal appearing in surface coil 1, due to a surface coil 2 signal, is decreased by a factor of 22 relative to the signal in surface coil 2; that is, a surface coil 2 signal is over 22 times less strong in surface coil 1 than in surface coil 2.

Individual images from each of a plurality of surface coils are useful, although the construction of a single composite image from the overlapping fields-of-view of an array of a plurality N of surface coils is highly desirable. If properly constructed, such a composite image will include quadrature components and will have a maximum possible signal-to-noise ratio (SNR). The amount of coil overlap required to substantially eliminate adjacent coil mutual inductance is substantially that amount of overlap which also yields a significant field-of-view overlap, allowing a single composite image to be constructed with a minimal SNR variation. The increased SNR, if realized at all, requires that the images from the various surface coils be combined on a point-by-point basis, utilizing a detailed knowledge of the magnetic fields of all of the surface coils, as well as of the correlated and uncorrelated noise between surface coils. The general sensitivity of a single coil is proportional to the transverse magnetic field that the coil creates at any point, for a given current; the coil noise voltage is proportional to the square root of the coil terminal resistance. The SNR at a volume element (voxel) located at a point (x, y, z) is $$SNR = \omega MVB_t(x,y,z)/(4KTR)^{\frac{1}{2}} \quad (10)$$

where $B_t(x,y,z)$ is the transverse magnetic field created by the surface coil at the point (x,y,z) for a unit current flowing in that surface coil, M is the magnetization per unit volume, V is the voxel volume, $\omega$ is the resonant frequency and R is the noise resistance $R_n$, which can be expressed in terms of a time average integral over the ohmic losses, such that $$R_n = <(1/\sigma)\overline{\int J \cdot J} d^3 v> \quad (11)$$

where $\overline{J}$ is the induced current density in the sample for unit current in the coil and $\sigma$ is the sample conductivity. If the induced current is expressed in terms of the electric field, noise resistance $R_n$ becomes $$R_n = <\sigma \overline{\int E \cdot E} d^3 v> \quad (12)$$

where $\overline{E}$ is the electric field produced for a unit current in the surface coil.

Figure 6:
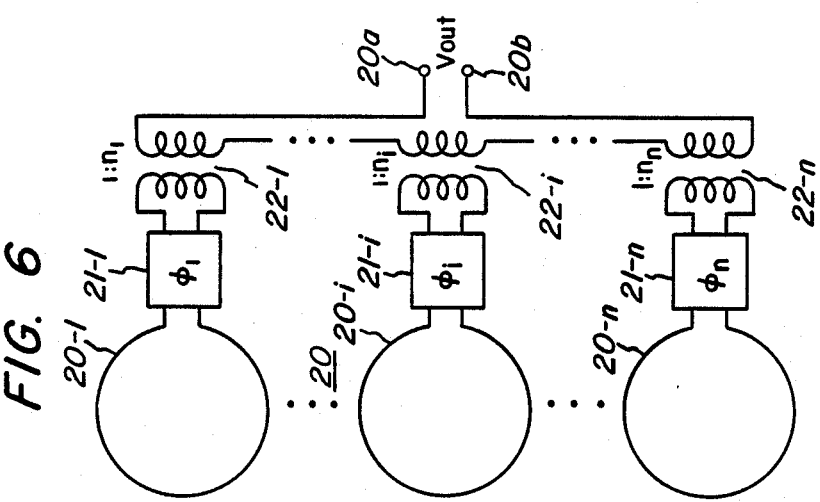
FIG. 6 is a schematic diagram illustrating the manner in which a plurality of surface coils may be coupled one to the other for correlated-noise calculation purposes.

As shown in FIG. 6, a plurality N of surface coils 20-1 through 20-n, of an array 20, can have their output voltages phase shifted, utilizing a like plurality N of phase shifters 21, and linearly combined, utilizing a like plurality N of transformers 22, to form a single output $V_{out}$ between array terminals 20a and 20b. Each of the transformers, considered to be an ideal lossless transformer, has a turns ratio $1:n_i$, for the i-th transformer 22-i, where $1 \leq i \leq N$. Each coil has an instantaneous output voltage $v_i(t)$ given by $$v_i(t) = \omega MVB_t(x,y,z)_i \cos(\omega t + \psi_m + \theta_i) \quad (13)$$

where $\theta_i$ is the angle of the RF magnetic field measured from some fixed reference in the laboratory frame and $\psi_m$ is an arbitrary phase of the rotating nuclei. The combined signal $V_{out}$ from the surface coil array 20, due to magnetization at some point (x,y,z) is $$V_{tot} = \omega MV \sum_{i=1}^{N} n_i[B_t(x,y,z)]_i \cos(\omega t + \psi_m + \theta_i + \phi_i) \quad (14)$$

The peak amplitude of this voltage is the desired signal and is given by $$|V_{tot}|^2 = \quad (15)$$

$$(\omega MV)^2 \left[ \sum_{i=1}^{N} n_i[B_t(x,y,z)]_i \cos(\omega t + \psi_m + \theta_i + \phi_i)^2 \right] +$$

$$\left( \left[ \sum_{i=1}^{N} n_i[B_t(x,y,z)]_i \sin(\omega t + \psi_m + \theta_i + \phi_i) \right)^2 \right]$$

As viewed from the arry output terminals 20a-20b, the total noise resistance is obtained by injecting a current of unit amplitude into the transformer secondaries and taking the time average of the losses integrated over the volume of the sample (a human patient and the like) being imaged. If a current of unit amplitude, $\cos(\omega t)$, is injected into the secondary windings of series-connected transformers 22, a current (phase shifted by an amount $-\phi_i$ and of amplitude $n_i$) flows in any coil 20-$i$. The total electric field in the sample is then given by $$\bar{E}_{tot} = \sum_{i=1}^{N} n_i \bar{E}_i \sin(\omega t - \phi_i) \tag{16}$$

wherein we have separated out the spatial dependence of the electric field, given by $\bar{E}_i$, and the time dependence. Combining equations (12) and (16), changing the order of integration and summation and averaging over time, the loss resistance, as seen from the transformer secondary, can be found as $$R_{tot} = \sum_{i=1}^{N} \sum_{j=1}^{N} n_i n_j R_{i,j} \tag{17}$$

where we have defined the mutual noise resistance $$R_{i,j} = (\sigma/2) \int \bar{E}_i \cdot \bar{E}_j d^3v \cos(\phi_i - \phi_j) \tag{18}$$

The noise resistance matrix will therefore contain all of the information about the correlated and uncorrelated noise between the surface coils. That is, $R_{i,j}$, where $i=j$, is the noise resistance of coil 20$i$, held in isolation; however, noise resistance $R_{i,j}$, where $i$ is not equal to $j$, is the added resistance when coil 20$i$ and coil 20$j$ are used in combination, therefore representing the correlated noise between surface coils 20$i$ and 20$j$. Note that the noise is completely uncorrelated if the electric fields are phase shifted by 90 degrees. The signal-to-noise ratio, at point (x,y,z) of the combined surface coil set is therefore $$SNR = |V_{tot}| / \sqrt{4KTR_{tot}} \tag{19}$$

where $V_{tot}$ and $R_{tot}$ are given by Equations (15) and (17). The optimum phase shifts are determined by taking the partial differential $\partial SNR/\partial \phi_i$ for each value of $i$ and equating the result to zero. We find that the resultant set of equations are satisfied if $\phi_i = -\theta_i$. Thus the optimum values to assign to the external phase shifts exactly cancel the phase shift of the induced NMR voltage. Substituting this value of $\phi_i$ into $V_{tot}$ of Equation (19) we obtain $$SNR = \omega MV \left( \sum_{i=1}^{N} n_i [B_t(x,y,z)]_i \right) / (4KTR_{tot})^{\frac{1}{2}} \tag{20}$$

This signal-to-noise equation applies equally as well to any method utilized for image summation, even though derived with the coils connected through a series of lossless phase-shifters and transformers. When the signals are combined to obtain a single optimum image, the turns ratios are interpreted, and computed, as the relative weights for combining each surface coil data in the combined image. Thus, we must choose the relative weights ($n_i$) of the surface coils so as to maximize equation (20) on a point-by-point basis if an improved SNR is to be realized at all points in an image. Equivalently, by minimizing the total noise resistance while holding the combined signal level constant, the SNR is maximized. We therefore want to minimize a function F where $$F = \sum_{i=1}^{N} \sum_{j=1}^{N} n_i n_j R_{i,j} + \lambda \sum_{i=1}^{N} n_i [B_t(x,y,z)]_i \tag{21}$$

where $\lambda$ is a Lagrange multiplier of the constraint on the signal level. Values $n_i$ which minimize equation (21) are obtained by setting the partial derivative of F, with respect to value $n_i$, to zero for each value $n_i$. The result is given by n, where $$\underline{n} = -\lambda \underline{R}^{-1} \underline{B}(x,y,z) \tag{22}$$

where $R^{-1}$ is the inverse of the noise resistance matrix $[R_n]$, B (x,y,z) is a vector containing the magnitudes of the transverse field created at point (x,y,z) by the surface coils, and n is a vector containing the optimum turns ratios, or weights. The exact value of $\lambda$ is relatively unimportant, since it will cancel out when the optimum weights solution of equation (22) is substituted into equation (20), to obtain the optimum SNR value. That is, the value of $\lambda$ is important only to scale the pixel intensities of the final composite image. It will be seen that the optimum weighting function, or set, is in general a function of pixel position. Thus, the NMR signal from each of the coils must be acquired separately and would only allow maximization, at best, of the SNR at a single point, if all of the severally acquired signals were added in some manner externally. Therefore, after each separate acquisition, a separate image should be reconstructed for each surface coil and then a single combined image must be constructed by adding the individual image results on a pixel-by-pixel basis, in accordance with equation (22). Although there is a phase shift in the instantaneous NMR signal in the coils, due to the different directions of the RF magnetic fields in the coils, forming a single image by combining weighted magnitude images is still correct. The phase shift is taken into account in the noise resistance matrix, as given by Equation 18 with $\phi_i = -\theta_i$, where $\theta_i$ is the direction of the magnetic field at position (x,y,z). It will be seen that the noise resistance matrix values can be based on measurement or calculation, although measured values are preferable, since actual measured values will take into account the small losses of the source coil and any associated protective circuitry; these losses only show up as contributing to diagonal terms in the noise resistance matrix, as such losses exhibit no correlation between coils. The computed matrix for a four-coil array 10″ (FIG. 4) is derived from the matrices of calculated mutual resistance $[R_n]$ (calculated from equation 18, with coil currents in phase), via equation 20, and mutual inductance $[L_m]$, with the noise resistance matrix corresponding to sample losses with the coils placed against an infinite half plane of conducting material.

MATRICES $$R_n = \begin{bmatrix} 1 & 0.40 & 0.147 & 0.078 \\ 0.40 & 1 & 0.40 & 0.147 \\ 0.147 & 0.40 & 1 & 0.40 \\ 0.078 & 0.147 & 0.40 & 1 \end{bmatrix}$$

-continued $$L_m = \begin{bmatrix} 1 & 0 & 0.007 & 0.0016 \\ 0 & 1 & 0 & 0.007 \\ 0.007 & 0 & 1 & 0 \\ 0.0016 & 0.007 & 0 & 1 \end{bmatrix}$$

It should be noted that, although the coil overlap forces the mutual inductance between adjacent coils to zero, there is still significant correlated noise indicated by the non-zero off-diagonal elements of the noise resistance matrix.

Figure 7:
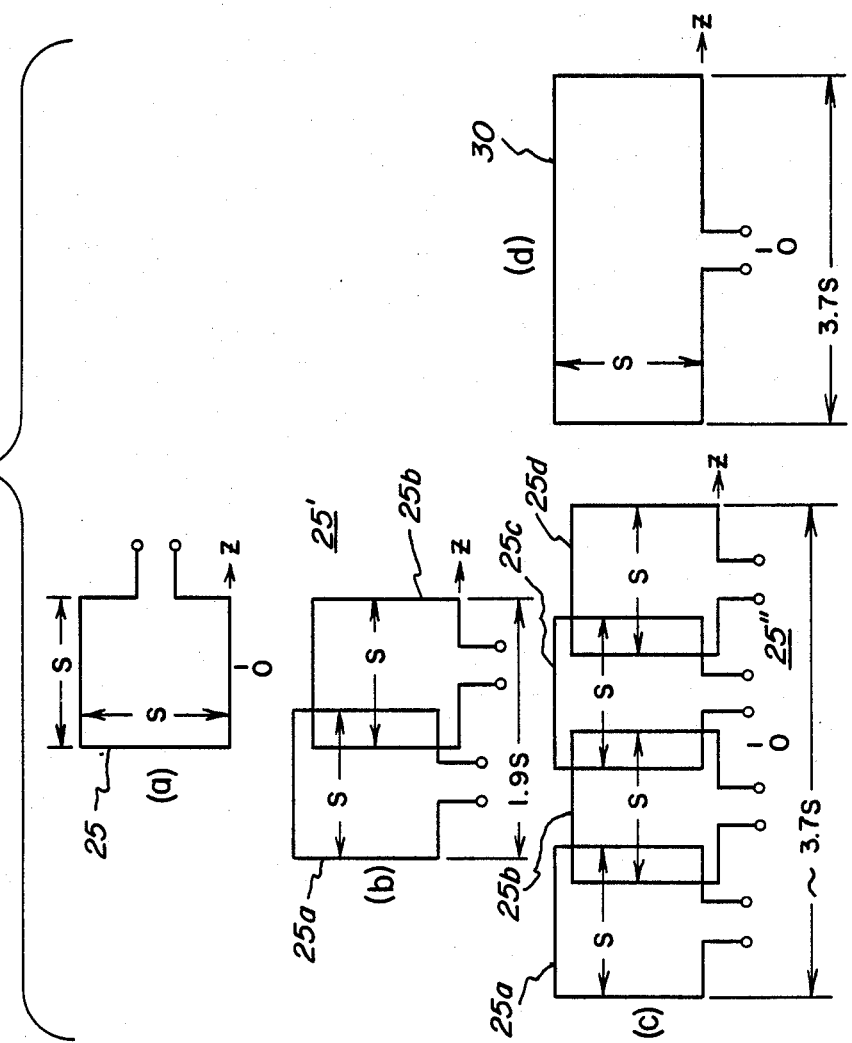
FIGS. 7 and 8 are, respectively, sets of various configurations of at least one surface coil, and a graph of the sensitivity s vs. frequency f response curves thereof.
Figure 8:
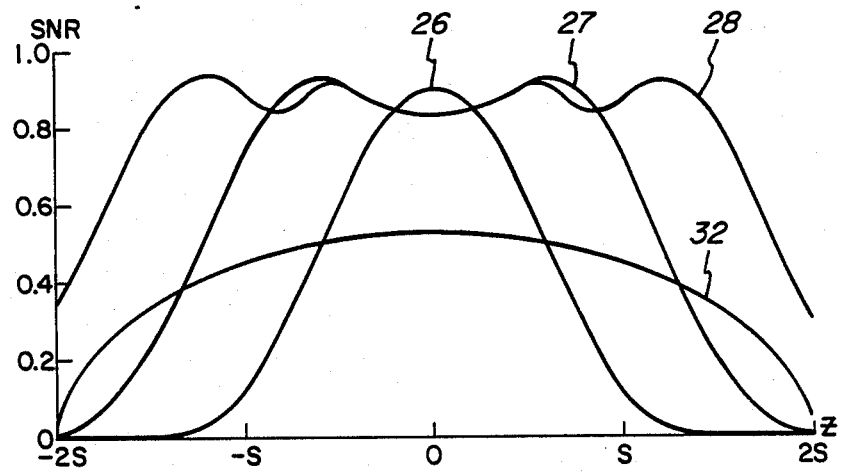

Referring now to FIGS. 7 and 8, the computed signal-to-noise ratio for a number of surface coil arrays are compared. In case (a) of FIG. 7, a single substantially—square surface coil 25 is so positioned about the zero center of a uniform object as to provide a SNR curve 26 (FIG. 8) having a normalized signal-to-noise ratio of 1.0 at Z=0. An arry 25' of a pair of the substantially-square surface coils 25a and 25b, separated by the overlapped distance for substantially zero interaction between adjacent surface coils, has a sensitivity vs. position curve 27 (FIG. 8), with a substantially constant SNR over the range from about Z=−S to about Z=−+S. An array 25" of four substantially square surface coils 25a-25d, arranged as shown in FIG. 4, has a SNR vs. position curve 28, with a substantially constant signal-to-noise ratio over a range from about Z=−1.6S to about Z=+1.6S. In contrast, a single, rectangular surface coil 30, having a width equal to the side dimension S of array 25" and the length of about 3.6S, substantially equal to the overall length of array 25", has a SNR vs. position curve 32, with a maximum relative SNR value of only about 0.5 of the four-surface coil array 25". It will therefore be seen that the composite of a plurality of surface coils has almost the sensitivity of a single surface coil, with the field of view of a larger single coil (which by itself has a lower sensitivity).

Figure 9A:
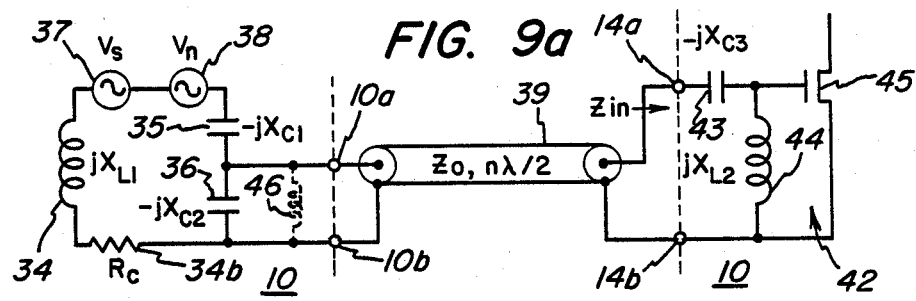
FIGS. 9a and 9b are schematic diagrams illustrating various methods for coupling surface coils to an associated preamplifier.
Figure 9B:
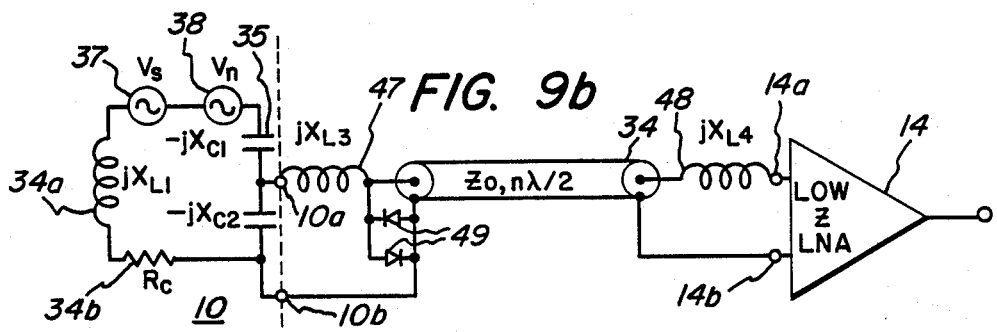

We presently prefer to have the surface coils 10, which are within the high-magnetic-field region of the NMR system, located at considerable distance from the associated preamplifier means 14, which are not in the high magnetic field region. As seen in FIG. 9a, the equivalent of surface coil 10 is an inductance 34a (with reactance $+jX_{L1}$). and resistance 34b (of magnitude $R_c$,) in series with tuning and matching capacitances 35 and 36, respectively, of reactance $-jX_{c1}$ and $-jX_{c2}$. The signal and noise voltages appearing across the surface coil are represented by the signal voltage $V_s$ source 37 and the noise voltage $V_n$ source 38. The surface coil terminals 10a and 10b are connected to a first end of a coaxial cable 39, having a length equal to an integral number of half-wavelengths at the NMR resonance frequency in use; the opposite cable end is connected to the input terminals 14a and 14b of the associated preamplifier. The surface coil is tuned to present a noise resistance, between terminals 10a and 10b, which is equal, under loaded conditions, to the characteristic impedance $Z_0$ of cable 39, so tht the cable adds a minimized amount of noise energy. Preamplifier 14 contains a series-resonant noise-matching network 42, comprised of a capacitor 43, (of reactance $-jX_{c3}$) and an inductance 44 (of reactance $+jX_{L2}$), which transforms the noise resistance to that resistance required to noise-match the input of a preamplifier active device 45, such as a GaAs-FET and the like. The preamplifier, having a very low noise figure, low input impedance and relatively wide bandwidth, can have its input capacitor 43 substantially mistuned without substantially degrading the preamplifier noise figure at a given frequency. Thus, the input impedance $Z_{in}$ of preamplifier 14 which is normally resistive and of a fairly low valve (less than about 5 ohms), when turned, can by proper adjustment of capacitor 43 be made to appear inductive, with a reactance $+jX_{c2}$. By thus returning the preamplifier to be inductive, the preamplifier input impedance $Z_{in}$ at the preamplifier end of the cable also appears as an inductive reactance 46 (shown in broken line) at the surface coil end of cable 39, and resonates with the surface coil output capacitor 36 to form a parallel-resonant blocking circuit which is active during reception to minimize current flowing in surface coil 10 and thus prevent noise (and signal) received by one surface coil from being coupled to other coils through their mutual inductances. Therefore, by causing each preamplifier 14 and associated cable 39 to present a parallel resonating inductance to the associated surface coil, images taken with the surface coil array will maintain a high SNR and shown substantially no evidence of coupling to other coils. Since the foregoing often requires that a specific cable 39 be used with a specific preamplifier 14, we prefer to tun the preamplifier input circuit 42 to resonance and utilize an external inductance 47 or 48 in series with the low input impedance preamplifier. This external inductance (of reactance $+jX_{L3}$) can be either an inductance 47, connected between the surface coil terminal 10a and the input center conductor of coaxial cable 39, or a physically separate inductance 48 (of reactance $+jX_{L4}$) connected between the center of the coaxial cable 39 at its output end and the associated low-noise amplifier (LNA) input terminal 14a. A combination of the two inductances 47 and 48 can also be used, if desired. This preferred use of at least one external inductance allows the preamplifiers to be interchanged without returning and permits the inductor to be used in forming a blocking circuit during transmission, in conjunction with a pair of anti-parallel-connected protection diodes 49.

Figure 10:
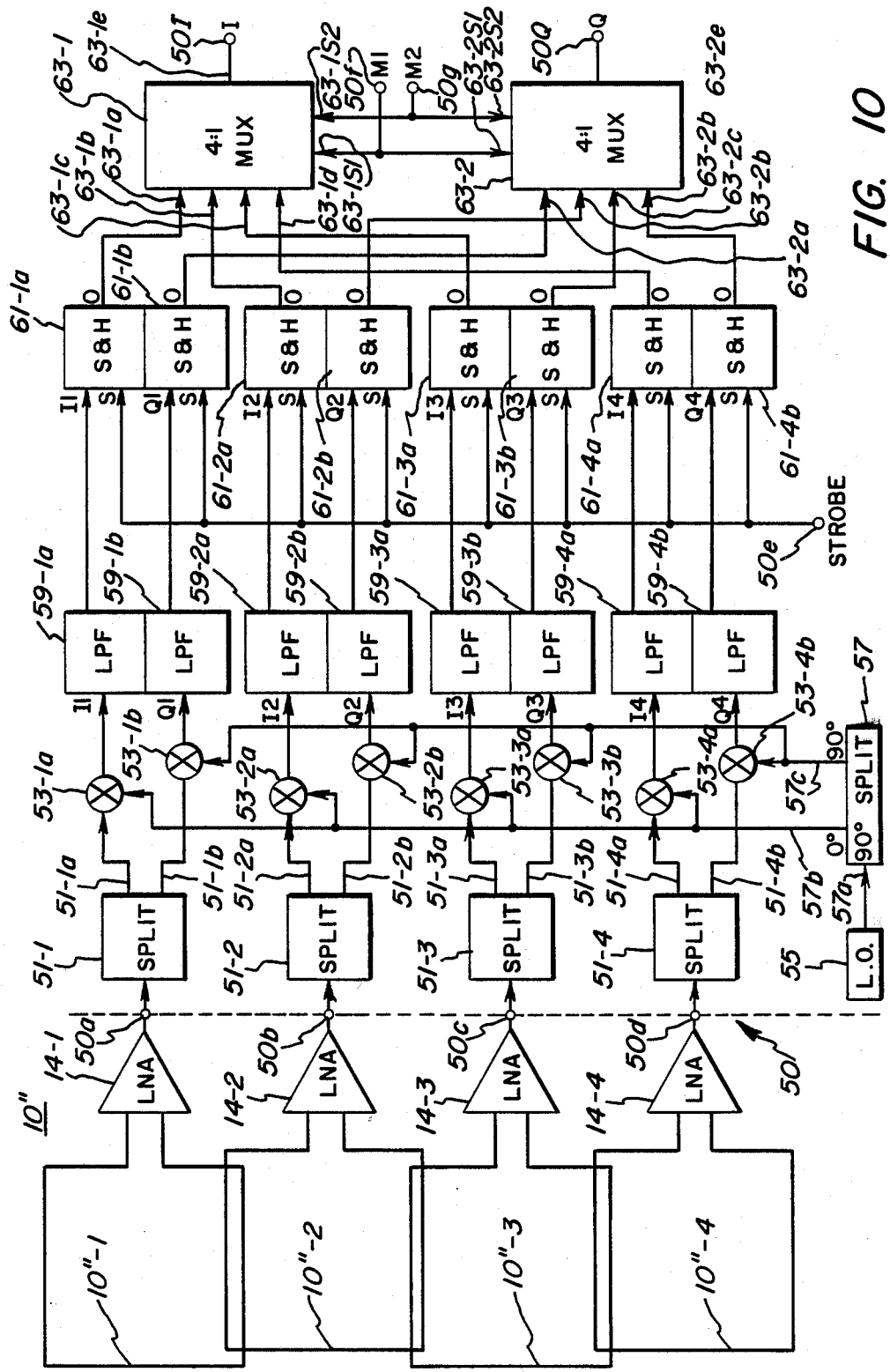
FIG. 10 is a schematic block diagram of apparatus for coupling the outputs of an array of a plurality of surface coils to quadrature-phase inputs of an NMR receiver, for imaging use.

Referring now to FIG. 10, a receiver front-end assembly 10 is shown for operating upon the plurality N of preamplified NMR response signals, equal in number to the number N of the surface coils in associated surface coil array 10", for generation into a pair of baseband quadrature signals for image processing and generation by means well known to the art. Thus, a surface array coil 10" has N=4 surface coils 10"-1 through 10"-4 and has associated low-noise amplifiers LNAs 14-1 through 14-4, each for providing a different preamplified reception signal to a different associated one of NMR receiver inputs 50a-50d. The single preamplified signal at one of inputs 50a-50d is applied to a signal input of an associated splitter means 51-1 through 51-4. Each splitter means provides a pair of in-phase signals at the pair of outputs 51-1a and 51-1b, 51-2a and 51-2b, 51-3aand 51-3b or 51-4a and 51-4b thereof. Each split signal is applied to the RF inoput of an associated one of a plurality (2N) of signal mixer means 53. A local oscillator means 55 provides a RF signal, at the Larmor resonance frequency of the molecule under study, to the input 57a of a quadrature signal splitting means 57. Each of a pair of quadrature-phase outputs 57b and 57c respectively provides a reference 0° signal and a quadrature 90° signal. The reference 0° signal at output 57b is coupled to the injection input of a first one of each pair of mixer means 53 connected to a like output of an associated one of splitters 51, while the quadrature 90° signal at splitter output 57c is connected to the injection input of the remaining plurality N of that mixer means. Thus, all of the "a" mixers, e.g., mixers 51-1a, 53-2a, 53-3a and 54-4a, receive the reference local oscillator signal, while the injection inputs of each of the "b" mixers, e.g., mixers 53-1b, 53-2b, 53-3b and 53-4b, receive the quadrature local oscillator signal. A baseband signal is provided at the output of each mixer means 53, with each of the "a" mixers, having received the reference 0° local oscillator signal, providing an in-phase I signal, and each of the "b" mixers, having received the quadrature 90° local oscillator signal, providing a quadrature-phase Q signal. Thus, in-phase base band signals I1–I4 are each respectively provided by an associated one of mixers 53-1a through 53-4a, while each of the quadrature-phase signals Q1–Q4 is respectively provided at the output of an associated one of mixers 53-1b through 53-4b. Each of the 2N baseband signals is individually filtered in an associated one of low pass filter means 59, and the filtered signal is provided to the signal input of an associated one of a plurality 2N of sample-and-hold (S&H) means 61, each also having a sample S input receiving a strobe signal from a front end input 50e. Thus, while all of the sample S inputs are connected in parallel, each of the signal inputs of the S&H means receives a different base band signal. That is: means 61-1 receives the filtered first in-phase I'1 signal; means 61-b receives the first quadrature-phase filtered signal Q'1; means 61-2a receives the second filtered in-phase I'2 signal; fourth means 61-2b receives the second quadrature-phase Q'2 signal, and so fourth. The output O of each sample and hold means 61 is connected to an associated input port of one of another plurality M of K:1 multiplexing (MUX) means 61. The number M of MUX 63 is given by M=2N/K; here, with N=4 and K=4, M=2 means 63-1 and 63-2. The particular one of the K inputs 63-1a to 63-1d or 63-2a through 63-2d, of respective means 63-1 or 63-2, connected to the single means output 63-1e or 63-2e (and therefrom to the I output 50-or the Q output 50-q of the front end means 50) is determined by the binary signal states of two multiplexing control signals M1 and M2, provided to the MUX means respective selection inputs 63-1s1 and 63-2s1, or 63-1s2 and 63-2s2, respectively, from front end means selection signal input terminals 50f or 50g, respectively.

In operation, front end means 50 continuously receives each of the plurality N or preamplified response signals, at the associated one of the plurality of N individual input terminals 50a. Each surface coil preamplified signal is split into two substantially equal-amplitude portions and is mixed with an in-phase or quadrature-phase local oscillator signal, and subsequently low pass filtered to provide continuous in-phase and quadrature-phase base band signals from each surface coil antenna. The signals are all sampled, substantially at the same instant, by action of each of means S&H 61 responsive to the common strobe signal. The held analog amplitude value of each of the two N signals is then multiplexed, by means 63 operating at K times the strobe frequency, so that time-diversity-multiplexed I or Q analog signals are provided to the subsequent processing means (not shown). It will be understood that greater or lesser numbers of surface coils in the array, and similar number of channels, multiplexing ratios and the like, are contemplated. It will be understood that the strobe signal can be synchronized directly to the multiplexed selection signal, by means well known to the signal processing arts; the frequency and form of strobe signal(s) are selected to satisfy well known signal processing constraints.

While several presently preferred embodiments of our novel multiple surface coil arrays and methods for NMR imaging with such arrays and for reducing interaction between elements of such arrays, have been described in detail herein, many variations and modifications will now become apparent to those skilled in the art. For example, there are cases where the detailed coil positions (and thus their corresponding magnetic fields) may not be known, such as in a flexible, wrap-around coil array whose location is dependent on the patient and the anatomy being imaged. Under these circumstances most of the advantage of receiving from an array of coils can still be realized by using the individual images as a measure of the coil's sensitivity, and by ignoring the noise correlations between coils. Thus, according to Equations 20 and 22, each pixel intensity in each image should be weighted by itself and then combined to form a single image. It is our intent, therefore, to be limited only by the scope of the appending claims and not by the specific details and instrumentalities presented by way of explanation of the embodiments described herein.

What we claim is:

1. A method for simultaneously receiving a different NMR response signal from each of a plurality N of RF surface coils, comprising the steps of:
    (a) providing an at least one-dimensional array of the plurality N of surface coils, with the array defining an imaging volume, with each surface coil being a single-turn surface coil substantially identical to any other surface coil of the array and with each surface coil being closely-spaced, to and having overlapping fields-of-view with, but having substantially no interaction with, at least all adjacent surface coils;
    (b) substantially simultaneously receiving at each different one of the plurality N of surface coils a different one of a like plurality N of NMR response signals each evoked from an associated portion of a sample enclosed in the imaging volume;
    (c) constructing each different one of a like plurality N of NMR images of a sample portion from the NMR response signals received by an associated surface coils; and
    (d) then combining the plurality N of different images, on a point-by-point basis, to produce a signal final NMR image of all sample portions from which a NMR response signal was received by any one of the surface coils.

2. A method for simultaneously receiving a different NMR response signal from each of a plurality N of closely-spaced RF surface coils, comprising the steps of:
    (a) providing an at least one-dimensional array of the plurality N of surface coils, with the array defining an imaging volume, and with each surface coil having substantially no interaction with at least all adjacent surface coils;
    (b) receiving at each different one of the plurality N of surface coils a different one of a like plurality N of NMR response signals each evoked from an associated portion of a sample enclosed in the imaging volume;

(c) constructing each different one of a like plurality N of NMR images of a sample portion from the NMR response signals received by an associated surface coils; and (d) the combining the plurality N of different images with weighting, on a point-by-point basis, each pixel of each image by a factor determined by at least by magnitude of correlated and uncorrelated noise between each adjacent pair of surface coils to produce a single final NMR image of all sample portions from which a NMR response signal was received by any one of the surface coils.

3. The method of claim 2, wherein step (d) further includes the step of also weighting each pixel of each image by a factor determined by the position of that pixel in at least one of the final and different images.

4. A method for simultaneously receiving a different NMR response signal from each of a plurality N of closely-spaced, substantially-circular-shaped RF surface coils, comprising the steps of:

(a) providing an at least one-dimensional array of the plurality N of surface coils, with the array defining an imaging volume, and positioning the centers of any pair of adjacent surface coils at a separation distance substantially equal to one and one-half times the radius of one of the surface coils of the pair to cause each surface coil to have substantially no interaction with at least all adjacent surface coils;

(b) receiving at each different one of the plurality N of surface coils a different one of a like plurality N of NMR response signals each evoked from an associated portion of a sample enclosed in the imaging volume;

(c) constructing each different one of a like plurality N of NMR images of a sample portion from the NMR response signals received by an associated surface coils; and (d) then combining the plurality N of different images, on a point-by-point basis, to produce a single final NMR image of all sample portions from which a NMR response signal was received by any one of the surface coils.

5. The method of claim 4, further comprising the steps of: arranging the array on a surface; and positioning the center of each different surface coil, in a group of three adjacent surface coils, substantially at a different apex of an equilateral triangle.

6. The method of claim 5, further comprising the step of arranging the surface to extend only in two dimensions.

7. A method for simultaneously receiving a different NMR response signal from each of a plurality N of closely-spaced, substantially-square-shaped RF surface coils, comprising the steps of:

(a) providing an at least one-dimensional array of the plurality of surface coils, with the array defining an imaging volume, and positioning the centers of any pair of adjacent surface coils at a separation distance of about nine-tenths of the side length of one of the surface coils of the pair to cause each surface coil to have substantially no interaction with at least all adjacent surface coils;

(b) receiving at each different one of the plurality N of surface coils a different one of a like plurality N of NMR response signals each evoked from an associated portion of a sample enclosed in the imaging volume;

(c) constructing each different one of a like plurality N of NMR images of a sample portion from the NMR response signals received by an associated surface coils; and (d) the combining the plurality N of different images, on a point-by-point basis, to produce a single final NMR image of all sample portions from which a NMR response signal was received by any one of the surface coils.

8. The method of claim 7, further comprising the steps of: setting N=4, and linearly arranging the four surface coils with a total of about 3.7 times the common side length.

9. Apparatus for simultaneously receiving NMR response signals from nuclei within a predetermine portion of a sample, comprising:

a plurality of substantially-identical single-turn surface coil antennae, each positioned to overlap at least a portion of at least one other surface coil and to simultaneously have substantially no interaction with at least all adjacent surface coils; and means for maintaining the positions of the surface coils in an array extending in at least one dimensional along a surface enclosing the sample.

10. Apparatus for simultaneously receiving NMR response signals from nuclei within a predetermined portion of a sample, comprising: a plurality of surface coil antenna with a selected one of (1) a substantially-circular shape and (2) a substantially-square shape, positioned in an at least one-dimensional array and with each surface coil having substantially no interaction with at least all adjacent surface coils by positioning the centers of any pair of adjacent surface coils to be separated from each other by a distance of (1) about one and one-half times the radius of one of the surface coils of that pair, if substantially-circular coils are utilized, and (2) by about nine-tenths of the side length of one of the surface coils of that pair, if substantially square coils are utilized.

11. The apparatus of claim 10, wherein the substantially-square-shaped coils are utilized, N=4 and the four surface coils are linearly arranged with a total length of about 3.7 times the common side length.

12. The apparatus of claim 10, wherein the array includes at least one pair of surface coils not adjacent to each other; and further including means for minimizing the interaction between each non-adjacent surface coil of that pair.

13. The apparatus of claim 12, wherein said minimizing means comprises a plurality of preamplifiers, each having an input impedance on the order of 5 ohms at the NMR response frequency; a different preamplifier being connected to the output of each different one of the non-adjacent surface coils and providing minimized interaction signal, for that associated surface coil, from the preamplifier output.

14. The apparatus of claim 12, further comprising means, operating with each different preamplifier, for reducing the current circulating in the associated surface coil during reception, without substantially changing the signal-to-noise ratio.

15. The apparatus of claim 13, wherein the number of preamplifiers is equal to the number of surface coils in the array and the output of each different surface coil is connected to an input of a different, associated preamplifier.

16. The apparatus of claim 15, further comprising means for substantially simultaneously obtaining the signals at the outputs of all preamplifiers and for then providing the obtained signals in a predetermined serial order for subsequent use.

17. A method for simultaneously receiving a different NMR response signal from each of a plurality N of closely-spaced RF surface coils, comprising the steps of:

(a1) providing an at least one-dimensional array of the plurality N of surface coils with the array defining an imaging volume, and with each surface coil having substantially no interaction with at least all adjacent surface coils;

(a2) and also providing in the array at least one pair of surface coils not adjacent to each other; and (a3) minimizing the interaction between each non-adjacent surface coil of that pair by: providing a preamplifier for each surface coil; connecting the output of each different one of the pair of non-adjacent surface coils to the input of a different preamplifier; and causing an effective input impedance of the preamplifier, at the associated surface coil, to resonate at the NMR response frequency with the output impedance of that surface coil and reduce the apparent surface coil Q towards a value of zero;

(b) receiving at each different one of the plurality N of surface coils a different one of a like plurality N of NMR response signals each evoked from an associated portion of a sample enclosed in the imaging volume;

(c) constructing each different one of a like plurality N of NMR images of a sample portion from the NMR response signals received by an associated surface coils; and (d) then combining the plurality N of different images, on a point-by-point bases, to produce a single final NMR image of all sample portions from whcih a NMR response signal was received by any one of the surface coils.

18. Apparatus for simultaneously receiving NMR response signals for nuclei within a predetermined portion of a sample, comprising:

a plurality of surface coil antennae, positioned in an array extending in at least one dimension along a surface enclosing the sample, each surface coil positioned to have substantially no interaction with at least all adjacent surface coils, and with at least one pair of surface coils not adjacent to each other; and means for minimizing the interaction between each non-adjacent surface coil of each pair thereof, and including: a plurality of preamplifiers, each having an input impedance on the order of 5 ohms at the NMR response frequency, with a different preamplifier being connected to the output of each different one of the non-adjacent surface coils and providing a minimized-interaction signal, for that associated surface, from the preamplifier output; and means, operating with each different preamplifier, for providing an effective impedance connected in parallel with the associated surface coil to resonate at the NMR response frequency and reduce the apparatus surface coil Q towards the value of zero to reduce the current circulating in the associated surface coil during reception, without substantially changing the signal-to-noise ratio.

* * * * *

UNITED STATES PATENT AND TRADEMARK OFFICE
CERTIFICATE OF CORRECTION

PATENT NO. : 4,825,162

DATED : April 25, 1989

INVENTOR(S) : Peter B. Roemer and William A. Edelstein

It is certified that error appears in the above-identified patent and that said Letters Patent is hereby corrected as shown below:

In the heading, inventor's name reading "Bernard Roemer" should read --Peter B. Roemer--.

Signed and Sealed this

Third Day of October, 1989

Attest:

DONALD J. QUIGG

*Attesting Officer*  *Commissioner of Patents and Trademarks*